United States Patent

Deutsch et al.

[15] 3,637,384

[45] Jan. 25, 1972

[54] POSITIVE-WORKING DIAZO-OXIDE TERPOLYMER PHOTORESISTS

[72] Inventors: Albert S. Deutsch, New York; Frank J. Loprest, Vestal, both of N.Y.

[73] Assignee: GAF Corporation, New York, N.Y.

[22] Filed: Feb. 17, 1969

[21] Appl. No.: 799,998

[52] U.S. Cl. ....................................... 96/36, 96/33, 96/36.2, 96/36.3, 96/75, 96/86, 96/91 D

[51] Int. Cl. ........................................................ G03f 7/08

[58] Field of Search .................... 96/91 D, 91, 75, 33, 49, 36, 96/36.3

[56] References Cited

UNITED STATES PATENTS

| | | | |
|---|---|---|---|
| 2,772,972 | 12/1956 | Herrick et al. | 96/91 |
| 2,797,213 | 6/1957 | Moore | 96/91 UX |
| 2,980,534 | 4/1961 | Printy et al. | 96/91 X |
| 2,990,281 | 6/1961 | Printy et al. | 96/91 X |
| 3,130,049 | 4/1964 | Neugebauer et al. | 96/91 X |
| 3,323,917 | 6/1967 | Straw et al. | 96/91 X |
| 3402,044 | 9/1968 | Steinhoff et al. | 96/91 |
| 3,474,719 | 10/1969 | Levinos | 96/75 |
| 3,495,979 | 2/1970 | Laridon et al. | 96/75 X |
| 3,502,470 | 3/1970 | Delzenne et al. | 96/91 X |
| 3,551,154 | 12/1970 | Di Blas et al. | 96/91 D |

*Primary Examiner*—Charles L. Bowers, Jr.
*Attorney*—Walter C. Kehm, Samson B. Leavitt, Walter G. Hensel and Morton Friedman

[57] ABSTRACT

A novel positive-working photoresist composition comprising a diazo-oxide such as N-dehydroabietyl-6-diazo-5(6H)-oxo-1-naphthalene-sulfonamide, a resin such as a terpolymer which contains carboxy groups, and a solvent therefor.

5 Claims, No Drawings

POSITIVE-WORKING DIAZO-OXIDE TERPOLYMER PHOTORESISTS

The instant invention is directed to a novel positive-working light-sensitive composition which has been found to be extremely useful in the preparation of offset printing plates, microelectronic circuits and printed circuits.

Light-sensitive compositions used in the microelectronic, the printed circuit, and the chemical milling industry are called photoresists. A photoresist has been defined as "an imagewise layer formed from a light sensitive material by exposure to a master pattern so as to produce a protective stencil on a surface and allow modification of the surface in such a way as to give a complementary or corresponding image." [M. Hepher, J. Photo. Sci., 12, 181 (1964)]. A photoresist may be either positive-working or negative-working; it is positive-working if it reproduces the tone values of the master pattern and negative-working if it reverses these tone values. Negative-working resists have been used for the most part in the above-mentioned industries.

Positive-working resists offer certain inherent advantages over negative resists. For example, the adhesion of the positive resists to the substrate is not "photogenerated" and it is, therefore, generally superior. One need not, therefore, depend on the exposure act to produce the substrate-protective layer. Intimately related to the aforesaid advantage is the ability to correct an underexposed positive resist by merely realigning the mask and giving the sample an additional exposure. This is, of course, impossible with a negative resist. Another advantage is the reduced effect of dust particles in causing pinholes. A dust particle in a negative resist is, of course, immediately converted into a pinhole. In a positive resist, the dust particle would presumably be converted to an "island," but we must realize that this "island" would be immediately undercut, leaving a clean, exposed area.

One of the particular processes previously employed to obtain positive working photoresists involves the use of orthoquinone diazides and their derivatives. In compositions of this type, an orthoquinone diazide is used as the light-sensitive component. This water insoluble compound is converted by exposure light into derivative compounds which are soluble in aqueous solutions of an organic base. This conversion is illustrated by the following general reaction scheme.

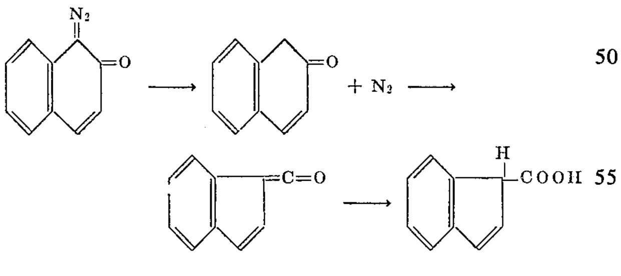

Many of the diazo-oxides which could have been employed in positive-working photoresist compositions have a strong tendency for crystallization, although some of these diazo-oxide derivatives have the ability of forming thin-films. However, the physical properties of such films are so inconsistent that high quality results are not to be expected. This crystallization tendency can be suppressed by incorporating large resinlike substituent groups into the diazo-oxide structure resulting in a more stable positive-working photoresist ingredient composition which is less subject to crystallization.

It has been proposed to use these orthoquinone diazide or diazo-oxide in combination with suitable resins. However, all of the combinations previously known possessed the inherent advantages of positive resists but were not free from defects. Many of them were attacked after exposure by the developer solution, thus, critically reducing the contrast and the edge sharpness. Others did not possess enough development latitude and/or sufficient adhesion to the support, thus, causing undercutting which may result in a deterioration of resolution and image quality, or may cause the coating to lift off and to float away. In addition, the positive resist compositions previously described had poor stability either before or after coating; they also lacked versatility, meaning that they could be used either with acid or with alkaline etch solutions but not with both. Finally, many of the positive resist materials of the prior art had to be heated after coating ("post baking") to make them etch resistant. This heating procedure introduced the additional disadvantage of making it very difficult to strip the residual coating after etching.

It will be understood that the usefulness of a positive-working, light-sensitive photoresist depends primarily upon three basic properties, the photochemistry of the light-sensitive ingredient, the developability of the exposed versus the unexposed portions of the resist, and the etch resistance of the resist. These properties are, of course, exceedingly complex and the interaction thereof leads to still further complexities and difficulties with regard to photoresist compositions.

With regard to the photochemistry of the light-sensitive ingredient, it is known that the addition of substituents to the automatic ring thereof, i.e., the ring which does not contain the diazo-oxide grouping, does not greatly affect the reactivity of the compound. Therefore, it can readily be appreciated that qualitatively the photochemical properties and behavior of the light-sensitive compound employed is not the critical nor determining factor in selecting a particular diazo-compound for use in a photoresist composition.

The second general property, developability, is by far the most important determining property, both in the selection of a given sensitive material and the other materials with which it is coated. The developability is a complex function of the physical and chemical properties of the coating ingredients and of the developer itself.

If one employs a sensitizer which is quite photochemically active and which is thereby rendered soluble in the aqueous base which serves as a developer, but uses an extremely hydrophobic forming vehicle with the sensitizer, then the light-struck portions of the coating will not be developable, since the aqueous developer base will be uniformly repelled from the surface. Conversely, if the sensitizer is dispersed in a vehicle which is too base-soluble, then there will be a tendency upon development to destroy the contrast between exposed and unexposed areas and to, eventually, completely remove the resist.

The final general property determining the usefulness of a resist is its resistance to the etch to be employed. In most cases, the etches are aqueous solutions of acids or bases. The more hydrophobic the resist layer is within the limits of developability, the better a resist is. A resist which is resistant to both acid and basic etch solutions is desirable on the basis of versatility. It is obvious that the properties of developability and etch resistance are at cross-purposes, especially as regards alkaline etch solutions. Developability is a complex function and requires an adequate balance of basic solubilities of the exposed areas versus base insolubilities in the unexposed areas.

Therefore, it is an object of the instant invention to provide a novel positive-working photoresist composition essentially free of the inherent disadvantages described above. These and other objects of the instant invention will become evident from the following description.

The instant invention is directed as discussed above to a novel positive-working photoresist composition which is comprised of N-dehydroabietyl-6-diazo-5(6H)-oxo-1-naphthalene-sulfonamide in combination with a selected terpolymer containing a carboxy group.

The diazo-oxide has the following formula:

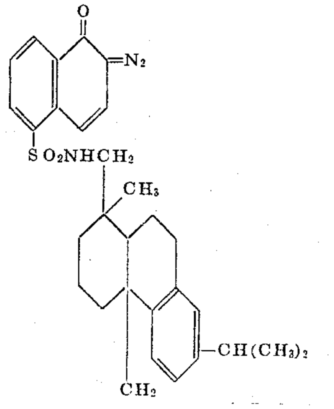

Presumably, by reason of the abietyl group which is affixed to a sulfonamide group substituent on the aromatic ring, this compound has pronounced hydrophobic properties and resists any tendency to crystallize from the coating containing the resinous terpolymer.

This compound may be prepared by the reactions of a selected diazo-oxide of an aromatic sulfonyl chloride with a suitable rosin amine. The reaction medium may be any liquid which is sufficiently good solvent for the starting materials so as to permit their interaction and which is inert towards the sulfonyl chloride so as to prevent mutual reaction under prevailing conditions. The instant compound may be prepared by adding to a stirred solution of rosin amine in dioxane or isopropyl alcohol, 6-diazo-5(6H)-oxo-1-naphthalene-sulfonyl chloride. Subsequent thereto, base may be added with continuous stirring over a period of approximately 2 hours and subsequently separating the desired compound. Further methods of preparing the compound of interest are disclosed in the U.S. Pat. No. 2,797,213, which patent is incorporated herein by reference.

We have unexpectedly found that the effectiveness of said compound, when employed in a photoresist, can be greatly improved by combining it with a resinlike synthetic material which has a certain degree of base solubility. Particularly effective for combination with the above N-dehydroabietyl-6-diazo-5(6H)-oxo-1-naphthalene-sulfonamide are terpolymers formed by the terpolymerization of three monomers illustrated by the combination of methyl acrylate, styrene, and acrylic acid. The terpolymers which have been found to be useful in the composition of this invention all contain carboxy groups (—COOH) in the range from about 3 to about 15 percent by weight. If the photoresist is formulated with a resin which contains less than about 3 percent carboxylic acid groups, incomplete development occurs. If the photoresists are formulated with resins that contain more than about 15 percent of carboxy groups, either overdevelopment or unsatisfactory etch-resistance results. Therefore, this range of from about 3 to about 10 percent is both preferred and critical with regard to the contact of carboxy groups in the terpolymers employed.

It has been found that the novel composition of the instant invention produces an extremely hydrophobic surface that is resistant to the attack of all commonly used etches whether alkaline or acid, for example, buffered hydrofluoric acid, hydrochloric acid, ammonium persulfate, ferric chloride, alkaline potassium ferricyanide and the like. This composition, therefore, provides greater protection of the substrate and results in a sharper image which has higher contrast.

When the novel composition of the instant invention is exposed to light, the solubilizing carboxy function is produced in a manner similar to that disclosed in connection with the use of orthoquinone diazides, noted above. The condition of the surface is drastically changed in the light-struck areas where an extremely hydrophobic surface is rendered soluble in aqueous base. Our composition is exceptional in that the degree of contrast which results between the exposed and unexposed areas of the surface provides a sharp high-contrast image. The unique ability of this compound to perform in the above described manner is attributed to the presence of the abietyl grouping which is bulky and insolubilizing in water while at the same time which grouping retains sufficient solubility in organic solvents such as methyl ethyl ketone and the like. This grouping, however, if not so bulky that the photoformed carboxy group cannot solubilize the compound to which it is attached.

As will readily be apparent from the above discussion, the key chemical moiety in the terpolymer resin is the carboxy grouping introduced by means of acrylic acid, methacrylic acid or maleic acid monomer. The ratio of the concentration of the other two monomers can be varied over an exceedingly wide range. Furthermore, other monomers may be substituted for both the methyl acrylate and styrene without any noticeable detrimental effects. For example ethyl acrylate, propyl acrylate, and the like may be used to replace the methyl acrylate monomer. With regard to the styrene monomer, other monomers such as p-methylstyrene, p-chlorostyrene, ethylstyrene, and the like may also be substituted without any resultant detrimental effects.

A preferred terpolymer for the use in the composition of the instant invention is one which is comprised of about 57.5 percent ethyl acrylate, 32.6 percent styrene and about 9.9 percent acrylic acid. A terpolymer of this type is commercially available from the Rohm & Haas Corporation under its trade name Acryloid AT-70. In addition, combinations of compatible resins may also be employed to impart either greater or lesser hydrophobicity or greater or lesser base solubility to the coating composition. In this connection, combinations of the above resins with fully esterified acrylic polymers or with hydrocarbon polymers have resulted in more hydrophobic coatings. Therefore, if one desires to vary the hydrophobicity of the coating, one may incorporate such resins as, for example, polymethacrylate, or the polymerized products of unsaturates occuring in coal tar, light oil, and some petroleum distillates (Picotex 100, Pennsylvania Industrial Chemical Corporation) and the like.

The proportion of N-dehydroabietyl-6-diazo-5(6H)-oxo-1-naphthalene-sulfonamide employed in relation to the resin may vary on a weight to weight ratio of from about 0.25 to about 4.0. The preferred ration, however, is one wherein the resin and the N-dehydroabietyl-6-diazo-5(6H)-oxo-1-naphthalene-sulfonamide are present in a ratio of 1 to 1. If a more protective coating is desired, however, the preferred proportion of the above compound should be increased relative to the amounts employed. This will produce a more hydrophobic coating, however, it is noted that the coating will require more exposure. If a greater photochemical speed is required, the above defined ratio should be reduced.

The corresponding loss in the hydrophobicity can be compensated for by a compatible, relatively base insoluble resin, as noted above.

As the third component of the instant invention, we employed a solvent which implements the subsequent coating of the composition. The resin and the N-dehydroabietyl-6-diazo-5(6H)-oxo-1-naphthalene-sulfonamide are soluble in a variety of solvents which have a large range of vapor pressures. The solvent employed must not interact with the ingredients of the coating composition. Its selection has a bearing on the coating method subsequently chosen.

It is also important that the solvent be easily removed after coating in a reasonable time of 1 hour or less and with moderate heating at temperatures below 50° C. Suitable solvents include, but are not limited to, acetone, methyl ethyl ketone, as well as mixtures of the preceding solvents with xylene, toluene, N-methyl-pyrrolidone and the like.

These coating compositions are coated onto suitable supports or substrates of the type employed in the microelectronic and printed circuit industry and to which the photoresist must be adherent. These substrates are silicon dioxide coated silicon, copper, chromium, gold, aluminum, platinum glass, nichrome and the like.

In addition, very satisfactory results are obtained with several types of bi- and trimetallic plates.

In one particular type of bimetallic plate used in the production of etched printing plates, a layer of a dissimilar metal is electroplated over a base metal. After application of the photosenstive coating and the subsequent application of developer, the deep-etching solution is used to etch the uncoated portion of the plate down to the base metal. When the plate is completed, therefore, the image and nonimage areas of the plate are comprised of dissimilar metals. The particular deep-etching solution used exposes the particular base metal desired which is either hydrophylic or hydrophobic depending upon which is required. Most bimetal plates of this type use copper for the image areas and chromium for the nonimage areas since copper can easily be made ink receptive and chromium can easily be made water receptive. For example, a solution of nitric acid can be used to render either copper or nickel hydrophobic and at the same time render chromium, stainless steel or aluminum hydrophylic. The same result can be achieved with a 2 to 5 percent solution of sulfuric acid or a 10 to 25 percent solution of a phosphoric acid. Thus, a satisfactory plate for use in this invention would involve any combination of copper or nickel for the image areas and chromium, stainless steel or aluminum for the nonimage areas.

An alternate type of plate, referred to in the industry as the "IPI Trimetal" plate, consists of a zinc or steel metal plate on which copper is electroplated to a thickness of about 0.001 inch. A very thin film of chromium, about 0.00005- to 0.00007-inch thick is electroplated over the copper. After the application of the photosensitive coating, exposure and development, the exposed surface of the plate is comprised of chromium metal. A special chromium etch is then used to dissolve the exposed chromium thereby exposing the copper underlayer.

Another type of plate consists of a sheet of aluminum which is electroplated with copper and then with chromium. This is processed in the same manner as the "IPI Trimetal" plate and is referred to as a "Lithure" plate.

A suitable bimetal plate is an "Aller" plate which consists of a base of stainless steel electroplated with copper. Another type of plate is the "Lithengrave" plate consisting of a base of aluminum electroplated with copper.

Our composition may be coated on the support by any of the known techniques, such as whirling, dipping, brushing, rolling and the like. The particular technique employed depends on the consistency, viscosity, and concentration of the composition.

The thickness of the coating retained on the plate generally ranges from about 0.1 microns, preferably from about 0.5 to 4 microns. When the coating is thicker, the time required for developing the plate increases and more active developers are required to yield comparable results. For any given method of applying the coating, it is desirable to use as high a solids content in the coating composition as possible.

After the coating is applied to the plate, it is permitted to dry. The plate can be maintained at room temperature so as to permit evaporation of the water or it can be put in an oven at a temperature of about 150° F. to accelerate the evaporation of water.

In connection with the instant invention in light of the very hydrophobic nature of the surface which results from the use of the instant positive-working photoresist composition, we have found that certain aqueous developer solutions are are especially useful in connection therewith, especially if very fine lines, i.e., on the order of 1 micron, are to be reproduced. We have found that aqueous developing solutions which contain organic amines, organic or inorganic bases, and small quantities of surfactants which lower the surface tension thereof below about 40 dyne-cm. are quite useful in this connection. The preferred developing compositions contain from about 1 to about 15 percent diethylethanolamine, diethylamine, diethanolamine, triethanolamine, or piperidine. In some cases, the addition thereto of 0.1 to about 0.5 percent by weight of a surfactant such as an alkyl aryl sulfonate or an ethylene oxide adduct of a long chain alcohol improves the quality of development. Furthermore, aqueous solutions of sodium hydroxide, sodium carbonate, sodium dihydrogen phosphate and the like may also be employed which solutions also contain between 0.1 and 0.5 percent by weight of the above noted surfactants. When these developers are employed, they produce good development without overall attack, i.e., loss of contrast.

Our photoresist compositions are superior to those described by the prior art. Among the most important advantages of our photoresist compositions are their excellent adhesion to a variety of substrates and the excellent etch resistance of the developed images. The photoresist compositions can be satisfactorily applied onto a variety of substrates including, but not limited to, copper, glass, silicon-dioxide-coated silicon wafers, phosphorus doped, silicon-dioxide-coated silicon wafers, chromium, platinum, gold, and aluminum. Once coated, our photoresist coatings show excellent adhesion to the substrate and do not require a baking or curing step either before or after development. The coating retains its satisfactory adhesion to the substrate after the solvent of the resist composition has been removed by a short drying step at a relatively low temperature ranging from about room temperature to about 60° C. Excellent adhesion of the resist coating to the substrate after development is a prime requisite in the production of detailed patterns by the chemical etch method. Otherwise, the substrate which is covered by the resist will be attacked by the etch solution.

The elimination of the curing step of the unexposed resist coating results is highly desirable as in the large-scale manufacture of printed circuits and microelectronic devices because it saves not only time, space, and thermal energy but it also facilitates the removal or stripping of the resist after etching.

Even at thicknesses as low as 0.3 microns, our resists were found to be outstanding in their resistance to a large variety of chemical etch solutions, including those of highly concentrated acids and bases, and solutions of strong reducing and oxidizing agents. Illustrations of such solutions which are used in chemical milling without attacking our resists are ammonium persulfate, hydrochloric acid, nitric acid, hydrofluoric acid, aqua regia, potassium iodide, iodine, potassium ferricyanide and mixtures thereof. The resists can, thus, be used in the chemical milling of many materials.

Other advantages inherent in the use of our photoresist composition are their improved development latitude, the high contrast and edge sharpness, their resistance against undercutting and the ease by which the resists can be stripped from the support after development and etching.

The present invention will now be described by reference to the following specific examples. Such examples are presented for purposes of illustration only, and the present invention is in no way to be deemed as limited thereto.

EXAMPLE 1

A positive-working photoresist formulation having the following composition was prepared:

| Component | Wt. Percentage |
|---|---|
| N-dehydroabietyl-6-diazo-5(6H)-oxo-1 naphthalene-sulfonamide | 5.8 |
| Terpolymer (57.5% ethyl acrylate, 32.6% styrene, 9.9% acrylic acid) | 5.8 |
| Methyl ethyl ketone | 40.0 |
| Xylene | 46.9 |
| Methyl cellosolve | 1.5 |

Coatings of the photoresist formulation were made on gold or aluminum coated ceramic substrates or on chromium coated glass plates or on silicon-dioxide-coated silicon wafers using a "Headway Spinner" at a speed of 25,000 r.p.m. for 20 seconds under relative humidity conditions less than 30 percent. The coating thicknesses obtained are of the order of 0.5 $\mu$, as determined by interferimetric measurements. The coated substrates were then subjected to a prebake treatment at 75°–85° C. for about 45 minutes and allowed to cool to room temperature. The coating was then contact exposed to a fine line negative mask of the type used in the microelectronics industry (1,3,10,15$\mu$ lines) using the high-pressure mercury arch (200 watts) in a collimating exposure tower manufactured by the Preco Corporation for 30 seconds to a modulated (neutral density filters) light beam of intensity in the actinic range (less than 450$\mu$) of 4,550$\mu$ watts/cm$^2$.

A developer solution having the following composition was prepared.

| Component | Wt. Percentage |
|---|---|
| $H_2O$ | 95.5 |
| Diethyl-ethanolamine | 4.0 |
| Tergitol-TMN 650 (2,6,8-trimethylnonanol-4+6 moles of ethylene oxide) | 0.5 |

The exposed substrates were developed with an aerosol spray of the developer solution for a period of from 5 to 15 seconds at a distance of 3 inches from the spray nozzle. Development by insertion into the developer solution with gentle agitation can be used instead. The substrates were rinsed with water and etched. The glass and silicon-dioxide-coated silicon wafer were etched with buffered hydrofluoric acid, while the chromium was etched with hydrochloric acid or alkaline potassium ferricyanide solution. A perfect reproduction of the model pattern was produced.

The results obtained by the material and procedure described were superior to those obtainable with the positive photoresist of the prior art. The exposed material possessed considerable development latitude permitting considerable variations, particularly extensions of development time. The photoresist formed possessed high contrast and edge sharpness. In spite of excellent adhesion prior to exposure, as well as during the development and etching steps, the resist could eventually be stripped with relative ease from the support.

EXAMPLE 2

The same photoresist composition and procedure was employed as in example 1 with the exception of the developer, which had the following composition:

| Component | Wt. Percentage |
|---|---|
| $H_2O$ | 89.6 |
| Diethylethanolamine | 10.0 |

The results were essentially similar when the developer was employed, as in example 1.

EXAMPLE 3

The same photoresist composition and procedure was employed as in example 1 with the exception of the developer, which had the following composition:

| Component | Wt. Percentage |
|---|---|
| $H_2O$ | 89.5 |
| Diethylamine | 10.0 |
| Wetsit (dodecyltoluenesulfonate) | 0.5 |

The results were essentially similar when the developer was employed as in example 1.

EXAMPLE 4

The same photoresist composition and procedure was employed as in example 1 with the exception of the developer, which had the following composition:

| Component | Wt. Percentage |
|---|---|
| N-dehydroabietyl-6-diazo-5(6H)-oxo-1-naphthalene-sulfonamide | 5.8 |
| Terpolymer | 4.3 |
| Piccotex 100 (a styrenated rubber obtained by the copolymerization of styrene and isoprene) | 1.5 |
| Methyl ethyl ketone | 40.0 |
| Xylene | 46.9 |
| Methyl cellosolve | 1.5 |

The results were essentially similar when the developer was employed as in example 1.

EXAMPLE 5

As in example 1 with the exception that the photoresist has the following composition:

| Component | Wt. Percentage |
|---|---|
| N-dehydroabietyl-6-diazo-5(6H) oxo-1-naphthalene-sulfonamide | 6.2 |
| Terpolymer | 3.1 |
| Polyvinyl methyl ether | 3.1 |
| Methyl ethyl ketone | 29.7 |
| Xylene | 34.5 |
| Methyl cellosolve | 0.8 |
| Toluene | 22.6 |

This resist produces coating thickness of about 1.0$\mu$ when applied as in example 1. The results were essentially similar when the developer was employed as in example 1.

EXAMPLE 6

As in example 1 with the exception that the photoresist has the following composition:

| Component | Wt. Percentage |
|---|---|
| N-dehydroabietyl-6-diazo-5(6H)-oxo-1-naphthalene-sulfonamide | 5.8 |
| Terpolymer | 4.3 |
| Polymethyl methacrylate | 1.5 |
| Methyl ethyl ketone | 40.0 |
| Xylene | 46.9 |
| Methyl cellosolve | 1.5 |

The results were essentially similar when the developer was employed as in example 1.

EXAMPLE 7

As in example 1 with the exception that the photoresist has the following composition:

| Component | Wt. Percentage |
|---|---|
| N-dehydroabietyl-6-diazo-5(6H)-oxo-1-naphthalene-sulfonamide | 4.3 |
| Terpolymer | 5.8 |
| Piccotex-100 | 1.5 |
| Methyl Ethyl Ketone | 40.0 |
| Xylene | 46.9 |
| Methyl Cellosolve | 1.5 |

Development was carried out with a 15 percent aqueous solution of diethyl ethanolamine. The results obtained were essentially the same as those reported in example 1.

What is claimed is:

1. A process for forming a resist image which comprises exposing imagewise to actinic light an element carrying on a suitable support a positive-working photoresist composition comprising N-dehydroabietyl-6-diazo-5-(6H)-oxo-1-naphthalene-sulfonamide and a terpolymer wherein one of the monomers of the terpolymer is selected from the group consisting of methyl acrylate, ethyl acrylate, and propyl acrylate, wherein a second monomer of the terpolymer is selected from the group consisting of p-methyl styrene, p-chloro styrene, p-ethyl styrene, and styrene, and the third monomer of the terpolymer is selected from the group consisting of acrylic acid, methacrylic acid and maleic acid, wherein the third monomer is present to the extent that the carboxylic acid group of the third monomer weighs from about 3–15 percent of the total weight of the three monomers; and developing the exposed element in a developer composition comprising an aqueous solution of a water soluble organic base, thereby removing the photoresist composition in the exposed areas.

2. A positive-working photoresist composition comprising N-dehydroabietyl-6-diazo-5-(6H)-oxo-1-naphthalene-sulfonamide; a terpolymer wherein one of the monomers of the terpolymer is selected from the group consisting of methyl acrylate, ethyl acrylate, and propyl acrylate, wherein a second monomer of the terpolymer is selected from the group consisting of p-methyl styrene, p-chloro styrene, p-ethyl styrene and styrene, and a third monomer of the terpolymer is selected from the group consisting of acrylic acid, methacrylic acid and maleic acid, wherein the third monomer is present to the extent that the carboxylic acid group of the third monomer weighs from about 3–15 percent of the total weight of the three monomers; and a solvent therefor.

3. A positive-working photoresist composition of claim 2 comprising a terpolymer composed of the monomers methyl acrylate, styrene and acrylic acid.

4. A presensitized printing plate comprising a base material having coated thereon a positive-working photoresist composition comprising N-dehydroabietyl-6-diazo-5(6H)-oxo-1-naphthalene-sulfonamide; a terpolymer wherein one of the monomers of the terpolymer is selected from the group consisting of methyl acrylate, ethyl acrylate, and propyl acrylate, wherein a second monomer of the terpolymer is selected from the group consisting of p-methyl styrene, p-chloro styrene, p-ethyl styrene and styrene, and a third monomer of the terpolymer is selected from the group consisting of acrylic acid, methacrylic acid and maleic acid, wherein the third monomer is present to the extent that the carboxylic acid group of the third monomer weighs from about 3–15 percent of the total weight of the three monomers.

5. The positive-working photoresist composition of claim 2 wherein the terpolymer comprises about 57.5 percent ethyl acrylate, 32.6 percent styrene and about 9.9 percent acrylic acid.

* * * * *